United States Patent
Wenk et al.

(10) Patent No.: US 8,887,382 B2
(45) Date of Patent: Nov. 18, 2014

(54) METHOD FOR MANUFACTURING A PENDULOUS ACCELEROMETER

(75) Inventors: Béatrice Wenk, Grenoble (FR); Jean-Francois Veneau, Eybens (FR); Greg Hames, Raleigh, NC (US)

(73) Assignee: MEMSCAP, Crolles (FR)

( * ) Notice: Subject to any disclaimer, the term of this patent is extended or adjusted under 35 U.S.C. 154(b) by 1156 days.

(21) Appl. No.: 12/329,122

(22) Filed: Dec. 5, 2008

(65) Prior Publication Data

US 2009/0145227 A1   Jun. 11, 2009

(30) Foreign Application Priority Data

Dec. 11, 2007   (FR) ...................................... 07 59753

(51) Int. Cl.
| | |
|---|---|
| *H05K 3/34* | (2006.01) |
| *G01P 15/125* | (2006.01) |
| *B81C 1/00* | (2006.01) |
| *G01P 1/02* | (2006.01) |
| *G01P 15/08* | (2006.01) |

(52) U.S. Cl.
CPC ......... *G01P 15/0802* (2013.01); *B81B 2203/04* (2013.01); *G01P 15/125* (2013.01); *B81C 2203/019* (2013.01); *B81C 1/00269* (2013.01); *G01P 1/023* (2013.01); *B81B 2201/0235* (2013.01)
USPC ................................ 29/840; 29/831; 438/456

(58) Field of Classification Search
USPC .............. 29/592.1, 830–832, 840; 73/514.18, 73/514.19; 438/107, 456
See application file for complete search history.

(56) References Cited

U.S. PATENT DOCUMENTS

| | | | |
|---|---|---|---|
| 5,616,844 A | 4/1997 | Suzuki et al. | |
| 5,905,203 A | 5/1999 | Flach et al. | |
| 6,311,556 B1 * | 11/2001 | Lefort et al. | ............... 73/514.29 |
| 6,872,902 B2 * | 3/2005 | Cohn et al. | .................... 438/456 |
| 2007/0062285 A1 | 3/2007 | Yamaguchi et al. | |

FOREIGN PATENT DOCUMENTS

FR         2763694         11/1998

OTHER PUBLICATIONS

Republic of France International Search Report dated Oct. 23, 2008 (2 pgs.).

* cited by examiner

*Primary Examiner* — Donghai D Nguyen

(57) ABSTRACT

The invention relates to a pendulous accelerometer including a pendulous electrode formed in a substrate, at least one counter electrode, and an encapsulation cover. The at least one counter electrode is formed under the cover, and spacers are positioned between the cover and the substrate.

10 Claims, 3 Drawing Sheets

METHOD FOR MANUFACTURING A PENDULOUS ACCELEROMETER

CROSS REFERENCE TO RELATED APPLICATIONS

This application claims priority under 35 U.S.C. §119 from French Patent Application No. 0759753 filed on Dec. 11, 2007 in the French Patent Office, the entire disclosure of which is incorporated herein by reference.

FIELD OF THE INVENTION

The invention relates to the field of pendulous accelerometers and gyrometers.

BACKGROUND OF THE INVENTION

A pendulous accelerometer is intended to measure the acceleration it sustains in a direction perpendicular to its principal plane. It commonly comprises a flat electrode formed in a Silicon on Isolator (or SOI) wafer and able to perform a rotary movement around an axis included in its plane (then referred to as a "pendulous" electrode), two counter-electrodes facing the pendulous electrode and forming with it two capacitances varying as a function of the angle of rotation of the pendulous electrode, the whole unit being encapsulated under an airtight cover and put under reduced pressure. An accelerometer of such a type is described for example in the document U.S. Pat. No. 5,905,203.

Hitherto the counter electrodes have been placed under the pendulous electrode and the electrical connections to the electrode and to the counter electrodes have been implemented in the SOI wafer. This involves in particular having a complicated layout of electrical connections in the SOI wafer, with the latter consequently occupying a significant amount of space, and using materials for the counter electrodes that are compatible with that of the SOI wafer, with these consequently being non-metallic materials.

Just like the previously described pendulous accelerometer, a pendulous gyrometer also comprises a mobile pendulous electrode associated with counter electrodes formed in an SOI wafer, and therefore offers identical drawbacks.

SUMMARY OF THE INVENTION

The purpose of the present invention is to resolve the aforementioned problem by proposing a pendulous acceleration sensor, and in particular an accelerometer or gyrometer, whereof the counter electrodes are dissociated from the wafer wherein the pendulous electrode is formed, which in particular allows a reduction, or even the disappearance, of the electrical connections therein, and a free choice of material for the counter electrodes.

To this end, the object of the invention is a method of manufacturing a pendulous acceleration sensor, and in particular an accelerometer or gyrometer, comprising the formation of a pendulous electrode in the thickness of a substrate.

According to the invention, this method is characterized in that it comprises the steps of: forming an encapsulation cover provided with at least one counter electrode thereunder; forming spacers of preset length under the cover and/or on the substrate; plating a eutectic coating under the cover and/or on the substrate, the thickness of the coating being greater than the length of the spacers; positioning the cover on the substrate; and fusing the eutectic coating.

In other words, the counter electrode or counter electrodes are placed under the encapsulation cover. Forming spacers and placing the cover by fusing the eutectic coating allows the distance separating the counter electrodes from the pendulous electrode to be accurately controlled, and this without damaging the elements of the accelerometer by thermal shock when the coating is fused on account of the low melting point thereof.

Until now it has been difficult to place the counter electrodes under the cover since the distance between the counter electrodes and the pendulous electrode had to be accurately controlled in order to obtain an accurate accelerometer. When the coating is fused, the cover rests on the substrate via the spacers whereof the length is precisely monitored at manufacture.

Furthermore, the fact that the counter electrodes are placed under the cover allows an electrical connection thereof through the cover. There is therefore no need to make provision for such connections in or under the substrate of the pendulous electrode. What is more, a wide choice of material for these is conceivable given their independence from the substrate.

According to particular embodiments of the invention, the method comprises one or more of the following characteristics.

The step of forming the cover comprises a step of forming a duct in the cover for the electrical connection of the at least one counter electrode.

The step of forming the cover comprises a step of forming an electrical connection element under the cover for the electrical connection of the pendulous electrode, and a step of forming a duct in the cover for the electrical connection of said element.

The eutectic material is an alloy of gold and silicon, an alloy of gold and indium, or an alloy of gold and tin.

A getter can be integrated between the cover and the substrate.

A further object of the invention is a pendulous acceleration sensor, comprising a pendulous electrode formed in a substrate, at least one counter electrode and an encapsulation cover, characterized in that the at least one counter electrode is formed under the cover, and in that it comprises spacers positioned between the cover and the substrate.

In particular the sensor is an accelerometer able to measure linear acceleration or a gyrometer able to measure angular acceleration.

BRIEF DESCRIPTION OF THE DRAWINGS

The invention will be better understood from reading the following description, given solely by way of example, and provided in relation to the appended drawings, wherein identical reference numbers denote identical or similar elements, and wherein.

DETAILED DESCRIPTION OF THE INVENTION

Figure 1:
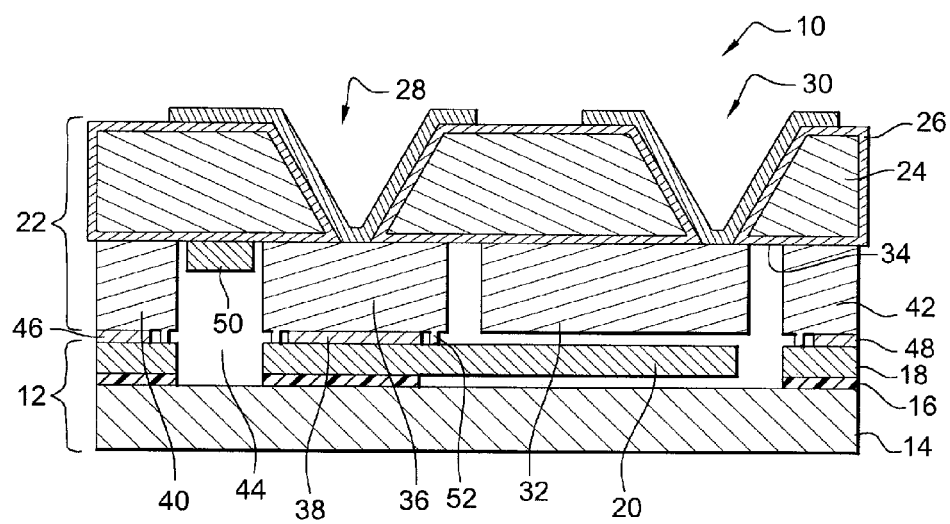
FIG. 1 is a cross-section view of an inventive accelerometer.
Figure 2:
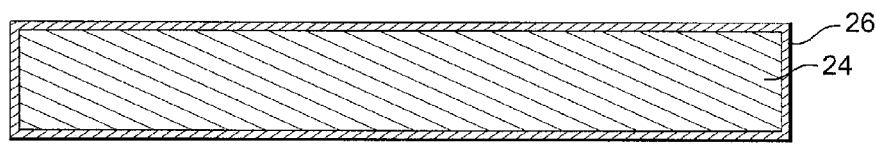
FIGS. 2 to 10 show a method of manufacturing the accelerometer in FIG. 1.
Figure 3:
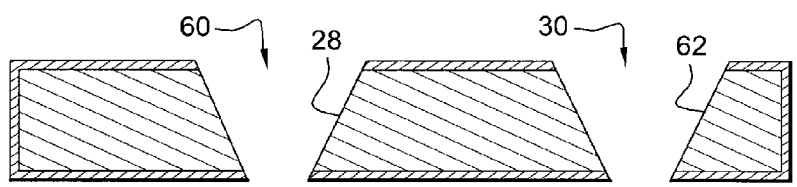
Figure 4:
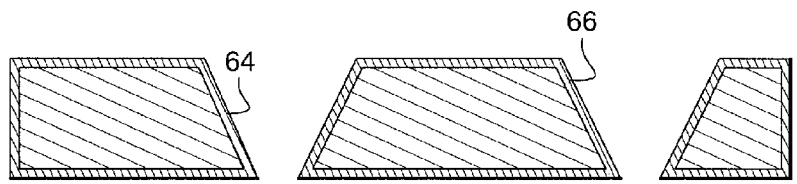
Figure 5:
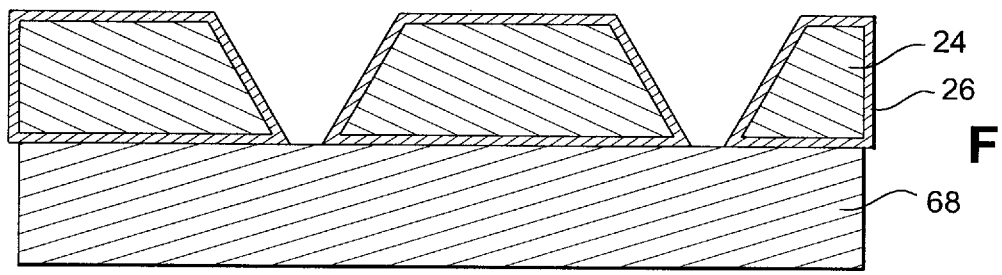

In FIG. 1, an accelerometer 10 comprises an SOI substrate wafer 12 with a first layer of silicon (Si) 14, a sacrificial insulating layer 16 of silicon dioxide ($SiO_2$) applied to the first layer of silicon 14, and a third layer of Si 18, applied to the second layer 16.

A pendulous electrode 20 is furthermore formed in the second layer 18, for example by means of a chemical attack of the Deep Reactive Ion Etching (or DRIE) type.

Provision is also made for an encapsulation cover 22 comprising a layer of Si 24 coated with a thermal oxide 26 and provided with two metallized ducts 28, 30.

A counter electrode 32 is furthermore provided under the lower surface 34 of the layer 24 facing the pendulous electrode 20 and is connected to the metallized duct 30.

An electrical connection block 36 is also provided under the lower surface 34 of the layer of Si 24. This block 36 is connected to the pendulous electrode 20 via a metallic material 38 and to the metallized duct 28.

The cover 32 further comprises lateral walls 40, 42 defining, with the substrate 12 and the layer 24, an internal space 44 wherein the pendulous electrode 20 and the counter electrode 32 are encapsulated. This space 44 is preferably made airtight using seals 46, 48 and put under vacuum. In some cases, provision is further made for a getter 50 to this end under the surface 44 of the cover 22.

Finally, spacers 52 are provided between the SOI substrate 12 and the cover 22 in order to accurately set the distance separating the pendulous electrode 20 from the counter electrode 32.

A method of manufacturing the accelerometer 10 will now be described in relation to FIGS. 2 to 10.

In a first step (FIG. 2), a wafer of silicon 24 with a thickness of 250 micrometers is coated with a 2 micrometer layer 26 of thermal oxide.

In a next step (FIG. 3), two ducts 28, 30 are formed in the thickness of the wafer 24, for example by lithography followed by a chemical attack by KOH. Next (FIG. 4), the lateral walls 60, 62 of the ducts 28, 30 are coated with a 2 micrometer layer 64, 66 of thermal oxide by oxidation.

Figure 6:
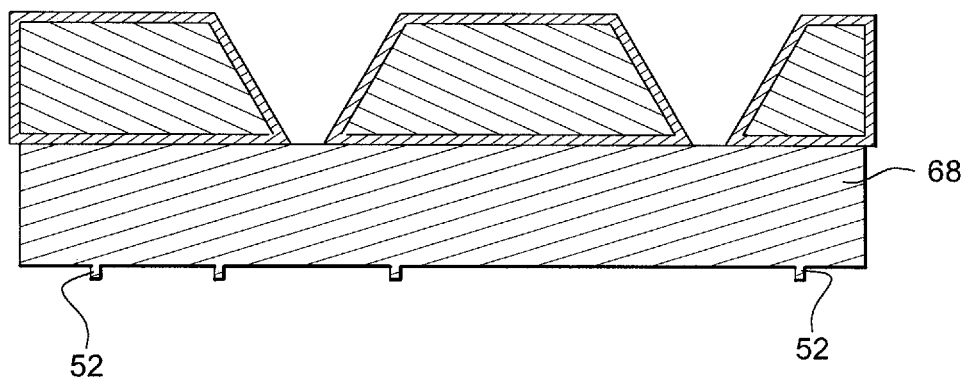
Figure 7:
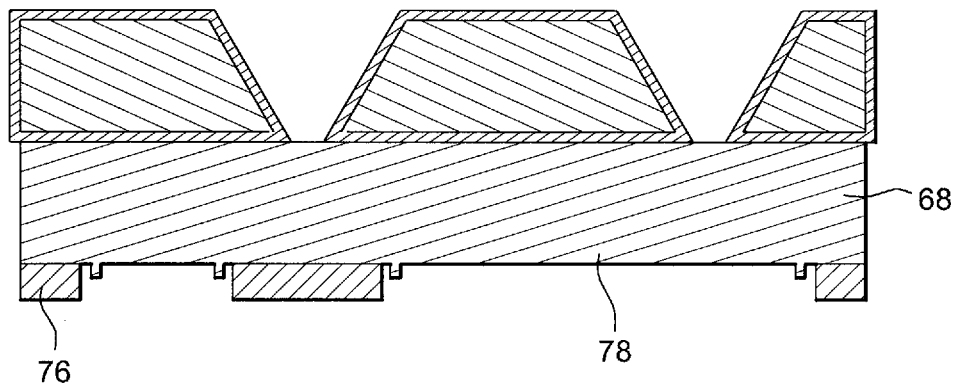
Figure 8:
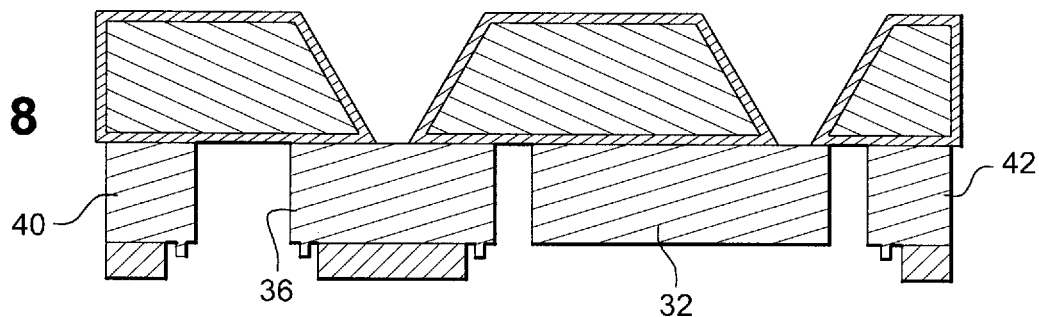

In a next step (FIG. 5), a wafer of silicon 68, with a thickness of 250 micrometers is fusion bonded under the wafer 24. Spacers 52 are then formed on the lower surface of the wafer 68 by lithography and chemical attack (FIG. 6).

In a next step (FIG. 7), the portion 74 of the layer of thermal oxide 70 coating the lateral walls of the wafer 68 is removed by chemical attack. Blocks 76 of gold and silicon alloy are then formed by electroforming (or electroplating) on the lower surface 78 of the wafer 68, the thickness of these blocks being greater than the length of the spacers 52 in such a way that the cover 22, once laid on the substrate 12, rests thereon.

Figure 9:
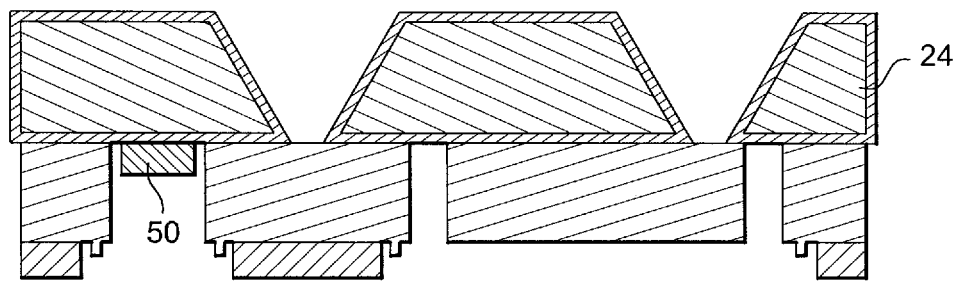
Figure 10:
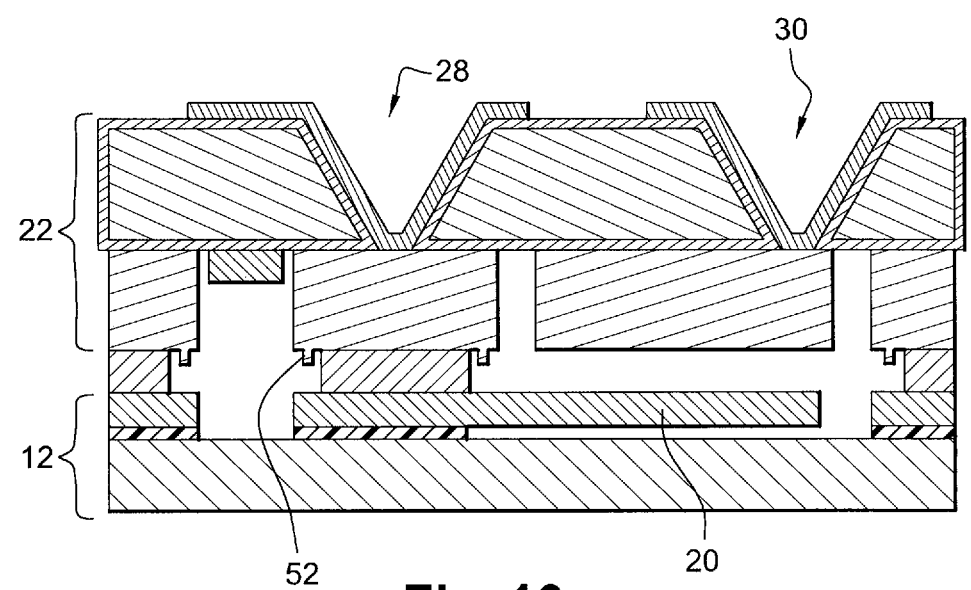

In a next step (FIG. 8), the different functional elements of the cover, namely the electrical connection block 36, the counter electrode 32 and the lateral walls 40, 42, are produced by lithography and attack of the Deep Reactive Ion Etching (or DRIE) type. Where appropriate, the getter 50 is then deposited under the wafer 24 (FIG. 9).

The cover 22 so obtained is then laid (FIG. 10) on the SOI wafer 12 wherein the pendulous electrode 20 has been formed. The cover 22 then rests on the blocks 76.

In a final step, the assembly is brought to a temperature of about 400° C. At this temperature the gold and silicon alloy, which forms a binary eutectic system with a eutectic temperature of 363° C., melts and acts like a solder.

Under the effect of the fusion of the gold and silicon alloy, the cover 22 then subsides, the subsidence of the cover 22 ending once the spacers 52 come into contact with the substrate wafer 12. It will be further noted that the temperature of 400° C. is too low to damage the components of the accelerometer 10, which is why a binary eutectic system has been selected.

Once melted, the gold and silicon alloy then forms seals 46, 48 hermetically closing the internal space 44 of the accelerometer 10. This alloy further provides electrical conduction from the connection block 36 to the pendulous electrode 20.

The walls of the ducts 28, 30 are then metallized.

A particular embodiment of the invention has been described. Clearly other embodiments are possible.

As an alternative, rather than the gold and silicon alloy, an alloy of gold and indium (In) or an alloy of gold and tin (Sn) is used.

A method of manufacturing a pendulous accelerometer has been described. The method just described also applies to the manufacture of a pendulous gyrometer comprising a pendulous electrode and counter electrodes.

By means of the invention, the following advantages are thus obtained: the counter electrode or counter electrodes are arranged under the cover and no longer in the substrate wherein the pendulous electrode is formed. The choice of materials for the counter electrodes is then free since there are no further compatibility constraints with the substrate as used to be the case in the prior art. Furthermore the electrical connections are also shifted into the cover. There is therefore no need to make provision for electrical connections in the substrate. Its dimensions may therefore be substantially reduced and manufacturing the accelerometer or gyrometer is made easier thereby the distance between the counter electrode or counter electrodes and the pendulous electrode is set accurately through the presence of the spacers and the particular assembly of the substrate and the cover by fusion of a eutectic material. The accuracy of the accelerometer or gyrometer is therefore preserved. Furthermore, the manufacture of the accelerometer or gyrometer is made easier. All the electrical connections are implemented through the cover and there is no preferential leak path in the electrical connections in the accelerometer or gyrometer. Leaks are therefore minimized; and the inventive manufacturing method allows a three axis accelerometer and/or a three axis gyrometer to be integrated on one and the same electronic component.

We claim:

1. A method of manufacturing a pendulous acceleration sensor, which comprises a pendulous electrode in a thickness of a substrate, the method comprising:
   (a) forming an encapsulation cover provided with at least one counter electrode thereunder;
   (b) forming spacers of a preset thickness on a first surface being one of the cover and the substrate;
   (c) plating a eutectic coating on a second surface being another of said one of the cover and the substrate, a first thickness of said coating measured from said second surface being greater than the preset thickness of said spacers from said first surface;
   (d) positioning the cover on the substrate; and
   (e) heating the eutectic coating causing a subsidence of the cover until said spacer contact said second surface, wherein after said subsidence, said coating is a second thickness equal to the preset thickness.

2. The method as claimed in claim 1 further comprising forming a duct in the cover for an electrical connection of the at least one counter electrode.

3. The method as claimed in claim 1 further comprising forming an electrical connection element under the cover for an electrical connection of the pendulous electrode, and forming a duct in the cover for an electrical connection of said electrical connection element.

4. The method as claimed in claim 1, wherein the eutectic coating is an alloy of gold and silicon, an alloy of gold and indium, or an alloy of gold and tin.

5. The method as claimed in claim 1, wherein it further comprises the integration of a getter between the cover and the substrate.

6. A method of manufacturing a pendulous acceleration sensor, which comprises a pendulous electrode in a thickness of a substrate, the method comprising:
(a) forming an encapsulation cover provided with at least one counter electrode thereunder;
(b) forming spacers of a preset thickness on a first surface being one of the cover and the substrate;
(c) plating a eutectic coating on said first surface, a first thickness of the coating measured from said first surface being greater than the preset thickness of the spacers from said first surface;
(d) positioning the cover on the substrate; and
(e) heating the eutectic coating causing a subsidence of the cover until said spacers contact a second surface being another of said one of the cover and the substrate, wherein after said subsidence, said coating is a second thickness equal to the preset thickness.

7. The method as claimed in claim 6 further comprising forming a duct in the cover for an electrical connection of the at least one counter electrode.

8. The method as claimed in claim 6 further comprising forming an electrical connection element under the cover for an electrical connection of the pendulous electrode, and forming a duct in the cover for an electrical connection of said electrical connection element.

9. The method as claimed in claim 6, wherein the eutectic coating is an alloy of gold and silicon, an alloy of gold and indium, or an alloy of gold and tin.

10. The method as claimed in claim 6, wherein it further comprises the integration of a getter between the cover and the substrate.

* * * * *